(12) United States Patent
Champinot et al.

(10) Patent No.: US 10,671,220 B2
(45) Date of Patent: Jun. 2, 2020

(54) MOVABLE OR DEFORMABLE TOUCH PAD SYSTEM FORMING A HUMAN-MACHINE INTERFACE SUITABLE FOR A VEHICLE STEERING WHEEL

(71) Applicants: CONTINENTAL AUTOMOTIVE FRANCE, Toulouse (FR); CONTINENTAL AUTOMOTIVE GMBH, Hannover (DE)

(72) Inventors: Sebastien Champinot, Aunay sous Auneau (FR); Stephane Melou, Rambouillet (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/557,851

(22) PCT Filed: Mar. 24, 2016

(86) PCT No.: PCT/EP2016/000515
§ 371 (c)(1),
(2) Date: Sep. 13, 2017

(87) PCT Pub. No.: WO2016/150572
PCT Pub. Date: Sep. 29, 2016

(65) Prior Publication Data
US 2018/0292949 A1    Oct. 11, 2018

(30) Foreign Application Priority Data

Mar. 26, 2015  (FR) ..................................... 15 52545

(51) Int. Cl.
*G06F 3/042*     (2006.01)
*H03K 17/968*    (2006.01)
(Continued)

(52) U.S. Cl.
CPC ............ *G06F 3/0425* (2013.01); *B60K 37/06* (2013.01); *B60Q 1/1484* (2013.01); *B62D 1/046* (2013.01);
(Continued)

(58) Field of Classification Search
None
See application file for complete search history.

(56) References Cited

U.S. PATENT DOCUMENTS 5,297,061 A * 3/1994 Dementhon .......... G06F 3/0346
345/156
5,297,063 A    3/1994 Cage
(Continued)

FOREIGN PATENT DOCUMENTS

CN     1842701     10/2006
CN   202016443     10/2011
(Continued)

OTHER PUBLICATIONS

International Search Report, dated Jun. 21, 2016, from corresponding PCT/EP2016/000515 application.

*Primary Examiner* — Dorothy Harris
(74) *Attorney, Agent, or Firm* — Young & Thompson

(57) ABSTRACT

Disclosed is a touchpad system forming a human-machine interface, intended for a vehicle steering wheel. The touchpad system includes a light source illuminating the touchpad and a camera capturing light coming from the touchpad. The touchpad includes a first marker able to reflect the light coming from the light source, and the touchpad, with the exception of the first marker, being transparent to the light emitted by the light source. The system is notable in particular in that pressure on the touchpad causes the touchpad to move and in that, when the touchpad is in a first position, the first marker is not visible to the camera and, (Continued)

when the touchpad is in a second position, the first marker is visible to the camera.

19 Claims, 3 Drawing Sheets

(51) Int. Cl.
*B60K 37/06* (2006.01)
*H03K 17/94* (2006.01)
*B60Q 1/14* (2006.01)
*B62D 1/04* (2006.01)
*H03K 17/96* (2006.01)

(52) U.S. Cl.
CPC ......... *H03K 17/941* (2013.01); *H03K 17/968* (2013.01); *H03K 17/9627* (2013.01); *B60K 2370/128* (2019.05); *B60K 2370/21* (2019.05); *B60K 2370/23* (2019.05); *B60K 2370/782* (2019.05); *G06F 2203/04102* (2013.01); *H03K 2217/94108* (2013.01); *H03K 2217/96042* (2013.01)

(56) References Cited

U.S. PATENT DOCUMENTS

| | | | |
|---|---|---|---|
| 6,766,036 | B1 | 7/2004 | Pryor |
| 6,909,084 | B2* | 6/2005 | Tachi .................. G01L 1/247 250/221 |
| 2004/0017473 | A1* | 1/2004 | Marks .................. G06F 3/017 348/207.1 |
| 2005/0098417 | A1* | 5/2005 | Miyako ................ B60K 35/00 200/61.54 |
| 2005/0129273 | A1* | 6/2005 | Pryor .................. A63F 13/06 382/103 |
| 2005/0189159 | A1* | 9/2005 | Weber .................. B62D 1/046 180/315 |
| 2006/0139322 | A1* | 6/2006 | Marks .................. G06F 3/017 345/156 |
| 2006/0277571 | A1* | 12/2006 | Marks .................. A63F 13/00 725/37 |
| 2008/0024463 | A1 | 1/2008 | Pryor |
| 2008/0245955 | A1* | 10/2008 | Tachi .................. G01L 1/247 250/221 |
| 2009/0195659 | A1* | 8/2009 | Nagata ................ G06F 3/03547 348/207.1 |
| 2009/0287361 | A1* | 11/2009 | Iwashima ............. B60K 37/06 700/300 |
| 2010/0110384 | A1* | 5/2010 | Maekawa .............. G02B 5/124 353/10 |
| 2010/0201652 | A1 | 8/2010 | Caliskan et al. |
| 2011/0241850 | A1* | 10/2011 | Bosch .................. B60K 37/06 340/384.6 |
| 2012/0068939 | A1* | 3/2012 | Pemberton-Pigott ........ G06F 3/016 345/173 |
| 2013/0076499 | A1* | 3/2013 | Okita .................. B60K 35/00 340/438 |
| 2013/0076615 | A1* | 3/2013 | Iao .................... G06F 3/017 345/156 |
| 2013/0300851 | A1* | 11/2013 | Lind ................... G02B 27/01 348/77 |
| 2014/0022070 | A1* | 1/2014 | Golomb ................ B60Q 1/0082 340/475 |
| 2014/0081521 | A1* | 3/2014 | Frojdh ................ H04M 1/72583 701/36 |
| 2014/0090505 | A1* | 4/2014 | Okuyama .............. G06F 3/0219 74/485 |
| 2015/0029111 | A1* | 1/2015 | Trachte ................ G06F 3/0418 345/173 |

FOREIGN PATENT DOCUMENTS

| | | |
|---|---|---|
| CN | 102741786 | 10/2012 |
| CN | 102929432 | 2/2013 |
| DE | 10 2007 017509 A1 | 10/2008 |
| JP | 2009 078604 A | 4/2009 |

* cited by examiner

MOVABLE OR DEFORMABLE TOUCH PAD SYSTEM FORMING A HUMAN-MACHINE INTERFACE SUITABLE FOR A VEHICLE STEERING WHEEL

The present invention relates to a touchpad system intended to perform a human-machine interface function in the zone of the steering wheel of a vehicle. More specifically, the invention relates to the modes of interaction, and notably the gestural and tactile interactions in the steering wheel zone.

More specifically still, the present invention proposes a system comprising a transparent touchpad, positioned in the steering wheel zone, making it possible, without the need for dedicated electronics in the region of said touchpad, to detect and interpret actions of the driver, whether these be actions of the click, double click type, or even more complex gestures.

BACKGROUND OF THE INVENTION

One problem set well known to those skilled in the art effectively lies in the possibility, on the one hand, of detecting the ability of the driver to actually control the vehicle he is at the controls of.

On the other hand, another well known problem set is that of providing the driver with an intuitive human-machine interface that allows him to interact with the vehicle without having to take his hands off the wheel, but also without the solution implemented necessitating the introduction of additional electronic means in the steering wheel zone. This is because one of the difficulties lies in the possibility of proposing solutions to the known aforementioned problem sets without requiring the use of complex electronic devices and without having to run additional wiring, particularly in the steering wheel zone, where the presence of wiring is particularly troublesome.

The prior art effectively comprises numerous electronic buttons devices incorporated into the spokes and hub of vehicle steering wheels. These include both simple buttons and two-directional control buttons, four-directional control buttons and even resistive or capacitive touch-sensitive surfaces.

However, the conventional buttons devices and other known devices have the major disadvantage of being cumbersome to incorporate into the design of the steering wheel, notably requiring the incorporation of dedicated electronics and the corresponding wiring, in a zone that is sensitive like that of the steering wheel maybe.

There is therefore a need for a human-machine interface system that allows the detection and interpretation of commands but does not require the presence of dedicated electronics in the steering wheel zone.

SUMMARY OF THE INVENTION

To this end, the present invention proposes the use of a camera, of the kind that can be installed for other applications into the instrumentation set of a vehicle instrument panel, such as for detecting sleepiness for example, so as to circumvent the aforementioned hardware constraints, with a view to detecting actions of the click or double click type, or even more complex gestures, in the steering wheel zone.

To this end, the present invention proposes a system relying on a transparent, mobile or deformable touchpad, a light source illuminating said touchpad and a camera capturing the images produced by the light coming from the source heading for the touchpad and reflected by one or more specific markers formed on said touchpad in the event of actions by the driver on said touchpad causing said touchpad to move. It should be noted that "movement" of the touchpad, or of part of the touchpad, means either a movement such as a rotation about a pivot or a translation, or a force deformation.

To this end, more specifically, the present invention relates to a touchpad system forming a human-machine interface, intended to be fitted, partially, to a vehicle steering wheel, so that a surface of said touchpad is accessible to at least one digit of a hand near the steering wheel. The touchpad system according to the invention is notable in that it comprises:

a light source illuminating the touchpad,
a camera able to capture light coming from the touchpad.

Said touchpad comprises at least one first mobile part, said first mobile part comprising a first marker able to reflect the light coming from the light source, and said first mobile part, with the exception of the first marker, being transparent to the light emitted by the light source.

Pressure on said first mobile part of the touchpad induces the first mobile part of the touchpad to move.

The first mobile part of the touchpad and the first marker are configured so that when the first mobile part of the touchpad is in a first position said first marker does not reflect light toward the camera and is therefore not visible to the camera and, when the first mobile part of the touchpad is in a second position, said first marker reflects light toward the camera and is therefore visible to the camera because of the movement induced in the first mobile part.

Said touchpad system comprises an electronic processing unit analyzing the light captured by the camera, said electronic processing unit being able to detect said pressure on the first mobile part of the pad corresponding to the detection of the passage of the first mobile part of the touchpad from the first position to the second position, or vice versa, according to whether or not light is reflected by the first marker toward the camera.

According to various embodiments, the steering wheel assembly according to the invention may further comprise one or more of the features set out hereinafter.

According to one embodiment, the first mobile part of the pad consists in a first deformable mobile part having a flexibility able to give said first deformable mobile part mobility in the event of pressure exerted on said first deformable mobile part of the touchpad. The deformation of said first mobile part therefore constitutes the movement of the first mobile part which is able to be detected by collaboration between the camera and the electronic processing unit.

According to one embodiment, the touchpad and the first mobile part are coincident and the first marker is the touchpad itself in the second position, the deformation imposed on said touchpad being above a deformation threshold, so that the touchpad, in the first position, is transparent to the light emitted by the light source, and said touchpad, in the second position that induces deformation of the touchpad above the deformation threshold, reflects at least some of the light emitted by the light source toward the camera.

According to a more sophisticated embodiment, said first deformable mobile part has a deformation plateau configured so that said first deformable mobile part deforms according to the pressure applied to said first deformable mobile part, and said first deformable mobile part passes from the stable first position to the stable second position discontinuously when the deformation generated by the pressure exerted on said first deformable mobile part reaches a predetermined deformation threshold.

According to an even more specific embodiment, said deformable mobile part comprises a domed zone of the touchpad, and the deformation generated by the pressure exerted on said first deformable mobile part, causing said first deformable mobile part to pass from the stable first position to the stable second position discontinuously because the deformation generated by the pressure exerted on said first deformable mobile part reaches a predetermined threshold, generates an artifact detectable by the camera and constituting said first marker.

According to another embodiment, the touchpad comprises a pivot mechanism providing rotational mobility of the touchpad about said pivot.

According to a first exemplary embodiment, the first marker is formed by a film applied to a suitable zone of the first mobile part of the touchpad.

According to a second exemplary embodiment, the first marker is formed by special paint applied to a suitable zone of the first mobile part of the touchpad.

According to a third exemplary embodiment, the first marker is formed by the creation of a roughened area on a suitable zone of the first mobile part of the touchpad.

According to one embodiment of the touchpad system according to the invention, the first mobile part of the touchpad has an edge face corresponding to the edge face of the touchpad, said edge face comprising said first marker, said edge face of the first mobile part of the touchpad lying in a plane that is inclined with respect to the camera so that the light coming from the source and potentially reflected by the first marker when the first part of the touchpad is in a first position is reflected in a direction such that said reflected light cannot be captured by the camera.

As a preference, the source emits light of a wavelength not visible to the eye. In this way, any risk of dazzling the driver is set aside.

Typically, the light source emits light of a wavelength in the infrared domain.

According to a more sophisticated embodiment, the touchpad comprises a second mobile part having a second marker distinct from the first marker, pressure on said second mobile part of the touchpad inducing the second mobile part of the touchpad to move, and the second mobile part of the touchpad and the second marker being configured so that, when the second mobile part of the touchpad is in a first position, said second marker does not reflect light toward the camera and is therefore not visible to the camera and, when the second mobile part of the touchpad is in a second position, said second marker reflects light toward the camera and is therefore visible to the camera as a result of the movement induced in the second mobile part, the electronic processing unit being able to detect said pressure on the second mobile part of the touchpad by means of the light reflected by the second marker and captured by the camera, making it possible to distinguish between pressure on the first mobile part of the touchpad and pressure on the second mobile part of the touchpad.

In this way, more complex interactions between the driver and the touchpad system according to the invention can be detected.

According to one embodiment, the touchpad system according to the invention comprises two touchpads which are intended to be positioned one on each side of a central hub of the steering wheel.

The present invention also targets a motor vehicle comprising a steering wheel, a dashboard and an instrument panel mounted on said dashboard, notable in that it comprises a touchpad system as briefly described hereinabove.

BRIEF DESCRIPTION OF THE DRAWINGS

The invention will be better understood from reading the following description, given solely by way of example, and by referring to the attached drawings in which.

DETAILED DESCRIPTION OF THE PREFERRED EMBODIMENTS

It should be noted that the figures explain the invention in detail in order to allow same to be implemented, it of course being possible for said figures also to help to better define the invention.

The invention is set out mainly with a view to being integrated into a motor vehicle. However, other applications are also targeted by the present invention, notably with a view to being integrated into any type of land, sea or air vehicle.

Figure 1B:
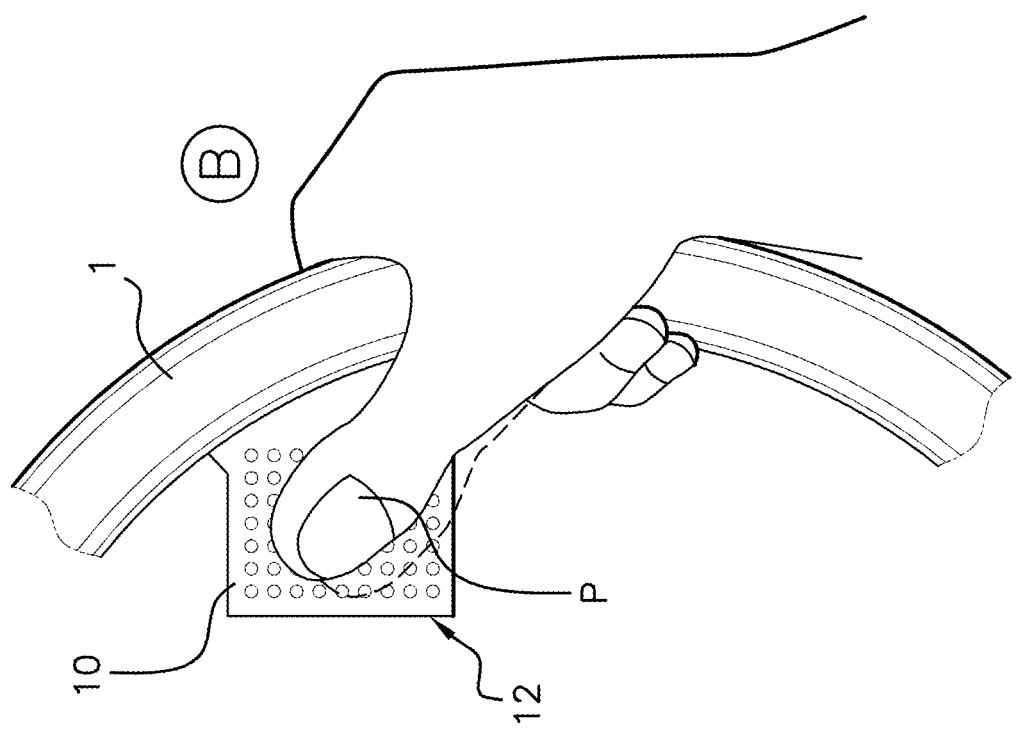
FIG. 1B is a diagram of part of the same example of a touchpad system according to the invention, showing a movement of the thumb over the active surface of the touchpad.
Figure 1A:
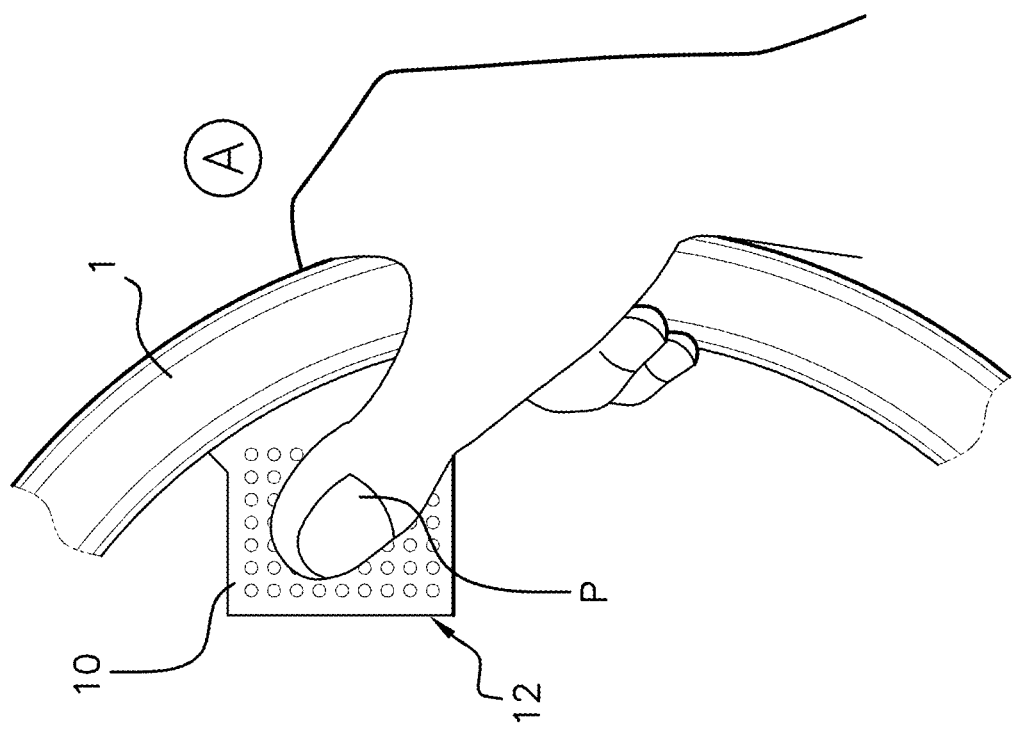
FIG. 1A is a diagram of part of one example of a touchpad system according to the invention.

With reference to FIGS. 1A and 1B, the touchpad system according to the invention is designed to be fitted to a vehicle steering wheel. The touchpad 10 is designed to be accessible to at least one digit P of the driver in the steering wheel 1 zone. According to the preferred embodiment depicted in FIGS. 1A, 1B, 2A, 2B, the touchpad 10 is, in particular, accessible to the driver's thumb P. The touchpad 10 is thus formed on the steering wheel 1 in such a way that it lies close to the probable zone in which the driver will grip the steering wheel 1, so that said touchpad 10 is preferably accessible to the driver's thumb P via the front surface thereof, with the surface situated facing the driver, without the latter having to let go of the steering wheel 1.

This preferred configuration in which the touchpad 10 is specially designed to be accessible to the driver's thumb P takes account, on the one hand, of the increasing agility of individuals, and particularly drivers, to use their thumbs to operate a human-machine interface and, on the other hand, of the fact that making a touch-sensitive human-machine interface available near the steering wheel 1, accessible to the thumb(s) and allows the driver to act on such an interface without letting go of said steering wheel 1, something which offers both a practical benefit of ease of access and a benefit in terms of the safety it affords.

Another possible configuration is to arrange the touchpad 10 in such a way that its rear surface, the surface facing away from the driver, is accessible to the digits of a driver's hand placed on the steering wheel 1.

Typically, the touchpad 10 is a transparent blade which may for example be made of glass or polycarbonate, polycarbonate being preferred for embodiments involving deforming the touchpad 10. The touchpad 10 may be fixed to the rim of the steering wheel 1, or even to the hub or to the steering column (neither of which is depicted). Fixing the touchpad 10 to the steering column is notably advantageous because it makes it possible to get around any potential problem associated with the steering wheel 1 rotating in a way that is not coaxial with the line of sight of the camera 20.

A light source 21 illuminates the touchpad 10, and a camera 20 is configured to capture the light coming from said touchpad 10. The images captured by the camera 20 are analyzed by an electronic processing unit 25. The light source emits light preferably of a wavelength not visible to the human eye. According to one preferred embodiment, the wavelength of the light emitted belongs to the infrared domain. Alternatively, said wavelength of the light emitted may belong to the ultraviolet domain.

The surface of the touchpad 10 is transparent to the light emitted by the light source, but comprises a marker, an artifact, able to reflect the light at the wavelength emitted by said light source. For example, said marker may be created on the edge face 12 of the touchpad 10.

Figure 2A:
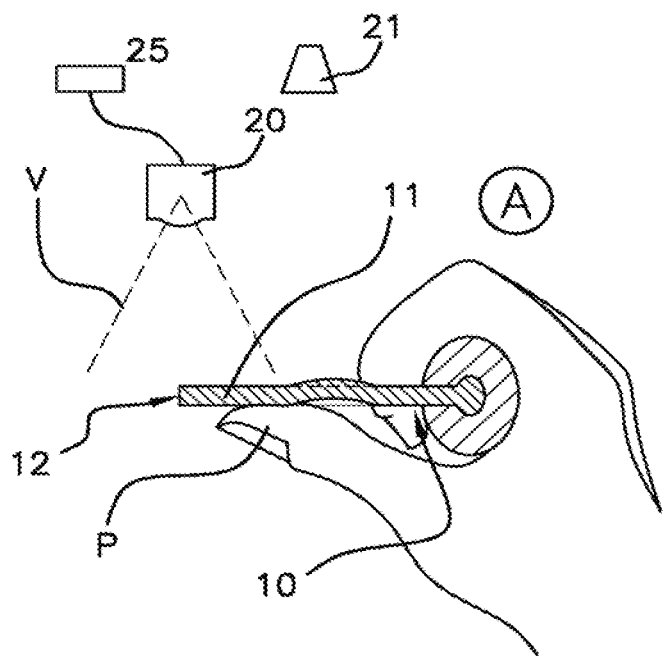
FIG. 2A is a diagram of a side view of a touchpad.
Figure 2B:
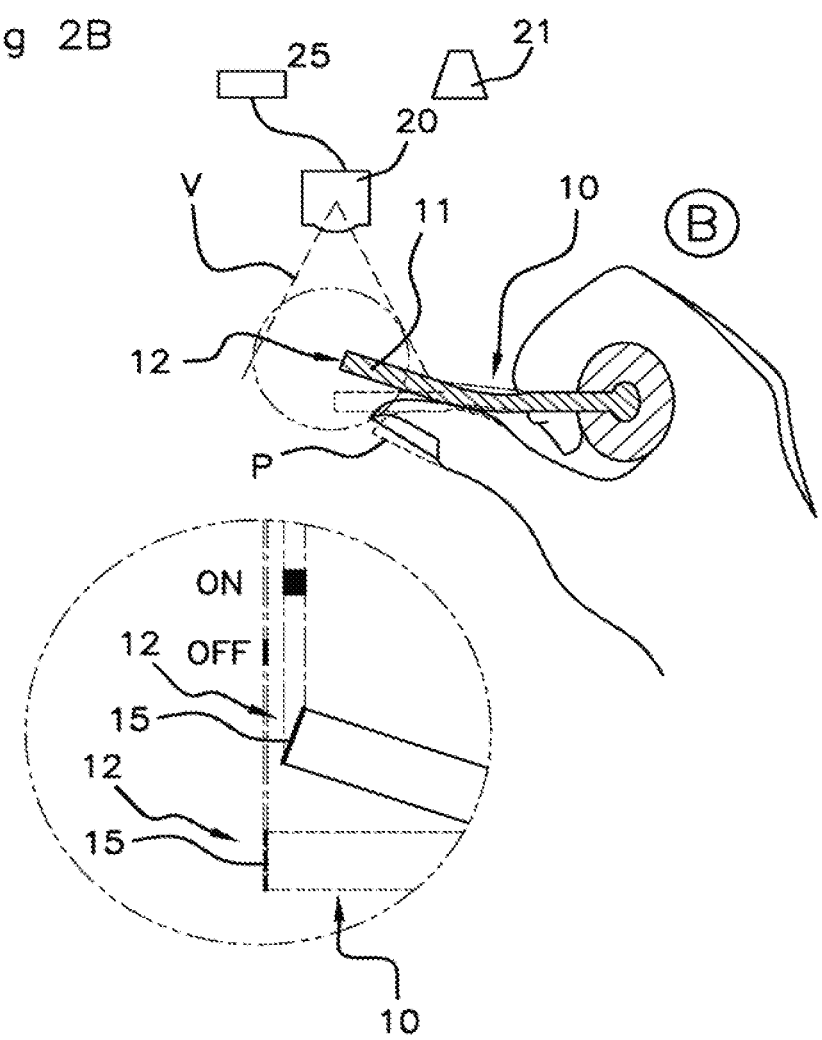
FIG. 2B is a view in section of one example of a touchpad that can be incorporated into the touchpad system according to the invention.

FIG. 2A is a view from above referring to the diagram of FIG. 1A, whereas FIG. 2B is a view from above referring to the diagram of FIG. 1B.

In a first position A, which may be a rest position and is stable, the camera 20 films the touchpad 10, but the electronic processing unit does not detect the marker 15 provided on the edge face 12 of the touchpad 10, because said edge face 12 is in a plane orthogonal to the camera 20 and the light potentially reflected by the marker 15 is therefore not reflected toward said camera 20.

In the first position A, the marker 15 is therefore not visible to the camera 20 because it does not reflect light toward said camera 20.

In a second position B, which may be a pressed position and is stable, the camera 20 films the touchpad 10 and the electronic processing unit detects the marker 15 created on the edge face 12 of the touchpad 10, because said edge face 12 is in the field of view V of the camera 20 and the light reflected by the marker 15 is therefore reflected toward said camera 20.

In the second position B, the marker 15 is therefore visible to the camera 20 because it reflects light toward said camera 20.

The touchpad 10 passes from the first position A to the second position B, or from the second position B to the first position A, when the driver either does or does not exert a sufficient pressure action on it.

Thus, the touchpad 10 has at least one mobile part 11. In the embodiments depicted in the figures, the entirety of the touchpad 10 is mobile.

As explained hereinabove, a zone of the touchpad 10, for example the edge face 12, forms or comprises a marker 15. The touchpad 10 is thus transparent to the light emitted by the light source, but said marker 15 which reflects said light is not.

Several nonexhaustive embodiments for creating said marker 15 are provided. According to a first embodiment, at least part of the edge face 12 is covered with a film, said part of the edge face 12 that is covered with a film forming said marker 15. According to a second embodiment, at least part of the edge face 12 is covered with a special paint, said part of the edge face 12 that is covered with special paint forming said marker 15. According to a third embodiment, the touchpad 10 is a blade of glass, or of any material having similar properties, and at least part of the edge face 12 is roughened, said roughened part of the edge face 12 forming said marker 15. According to a fourth embodiment, the touchpad 10 is made of polycarbonate, or of any material having similar properties, and has undergone a surface treatment suitable for, in combination with a deformation imposed by the driver on the mobile part 11 of the touchpad 10, creating an artifact that forms said marker 15.

According to another embodiment, the marker 15 is produced by means of a special configuration of the touchpad 10. According to this particular embodiment, the touchpad 10 has a structure and is made of a material such that a change in the light-defracting properties of the touchpad 10 occurs as a function of the deformation imposed on said touchpad 10. Thus, in a first position, for example a rest position, the touchpad 10 is transparent to the light emitted by the light source; but when the deformation of the touchpad 10, generated by a pressing action exerted by the driver, reaches a predetermined threshold the touchpad 10 changes in optical property and becomes opaque to the light emitted by the light source, the touchpad 10 then reflecting some of said light toward the camera 20.

Figure 3A:
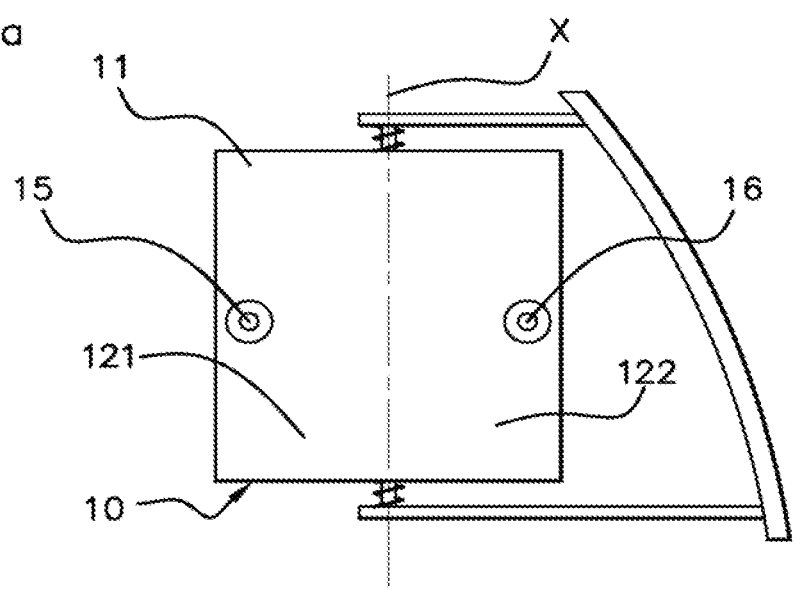
FIG. 3A depicts one example of a mobile touchpad, with central pivot, viewed face-on and in the rest position.
Figure 3B:
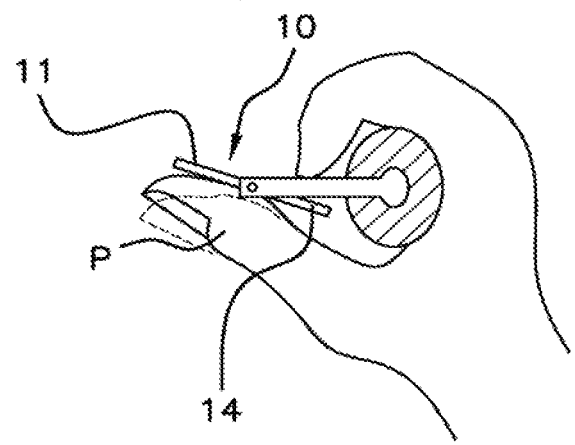
FIG. 3B depicts one example of a mobile touchpad, with central pivot, in side view and in a pressed position.

With reference to FIGS. 3A and 3B, according to another embodiment, the touchpad 10 comprises, along a median axis X, a pivot about which said touchpad 10 is rotationally mobile. According to this embodiment, each edge face 121, 122, situated one on each side of said pivot of axis X, has a marker 15, 16.

As a result, pressure on one side of the pivot, on a first part 11 of the touchpad 10, exhibiting a first marker 15 formed on the first edge face 121, parallel to the axis of the pivot, allows the camera 20 to capture an image of said first marker 15 and allows the electronic processing unit to identify said first marker 15. Likewise, pressure on one side of the pivot, on a second part 14 of the touchpad 10, on the other side of the pivot, exhibiting a second marker 16 formed on the second edge face 122, parallel to the axis of the pivot, allows the camera 20 to capture an image of said second marker 16 and allows the electronic processing unit to identify said second marker 16.

According to this embodiment, depicted in FIGS. 3A and 3B, the electronic processing unit detects the first marker 15 or the second marker 16 depending on whether the driver is pressing on the touchpad 10 on one side of the pivot or on the other side of the pivot. It is therefore possible to identify movements on both sides of the pivot and in both directions—push or pull.

To sum up, the electronic processing unit analyzes the images captured by the camera 20 recording the light emitted by the light source reflected at the touchpad 10. By means of at least one marker 15 formed on said touchpad 10, the electronic processing unit detects a change in state of said touchpad 10: a deformation, a movement, a change in light-defracting property. This change in state may of course be detectable in both directions: the electronic unit does not detect the marker 15 when the touchpad 10 is in a first position, detects the marker 15 when the touchpad 10 is in a second position, no longer detects the marker 15 when the touchpad 10 is once again in the first position, so that the touchpad 10 system according to the invention is able to detect actions of the "pull" type just as it is actions of the "push" type.

Furthermore, according to various more sophisticated embodiments, the system according to the invention comprises means for creating a click effect, namely for passing from a first stable state corresponding to the first position of the touchpad 10, to a second stable state corresponding to the second position of the touchpad 10.

Figure 4A:
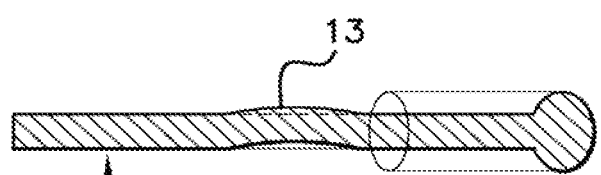
FIG. 4A depicts one example of a touchpad with a deformable domed part, in the rest position.
Figure 4B:
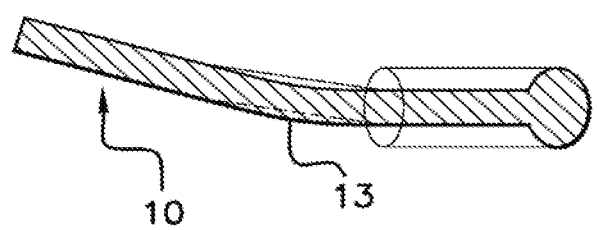
FIG. 4B depicts one example of a touchpad with a deformable domed part, in the pressed position.

With reference to FIGS. 4A and 4B, which refer back respectively to FIGS. 2A and 2B, the touchpad 10 system according to the invention may comprise a domed zone 13.

Through a special shaping of the touchpad 10, the latter thus has a deformation plateau such that said touchpad 10 offers resistance if pressure is applied to it by the driver, up to a certain point in the deformation at which the curvature of the domed zone 13 reverses sharply to create the sensation of a click.

Alternatively, in order to create this click sensation, a spring-loaded mechanism simulating this plateau effect is provided.

Furthermore, the embodiments of the touchpad 10 system which have been described hereinabove are compatible with an embodiment in which the system comprises means, notably incorporated into the electronic processing unit, that allow any contact between the driver's thumb P and the surface of said touchpad 10 to be detected. To do that, the electronic processing unit analyzes the light captured by the camera 20 and determines the distance between said camera 20 and the driver's thumb P captured in the same image. Depending on the light captured by said camera 20 after being reflected by said thumb P, using a light propagation time calculation, the electronic processing unit determines the position of the thumb P with respect to the surface of the touchpad 10, at the same time determining whether or not there is contact between said thumb P and the touchpad 10.

To sum up, the system according to the invention relates to a touchpad 10 system which can act as a human-machine interface in the steering wheel 1 zone of a vehicle. According to the invention, deformation or mobility of the touchpad 10 is rendered detectable by an electronic processing unit that analyzes the images captured by a camera 20 filming said touchpad 10 illuminated by a light source, by means of a marker 15 able to reflect the light emitted by the light source when the touchpad 10 is in a second position B, or pressed position, whereas in a first position A, or rest position, the touchpad 10 is transparent to the light emitted by the source.

In this way, the driver, pushing or pulling on the touchpad 10, interacts with the vehicle.

One possible use of the touchpad system according to the invention is in the creation of touchpads for electronic gearshifts in collaboration with sequential gearboxes in motor vehicles.

It must also be emphasized that the present invention is not restricted to the examples described hereinabove and can be varied in numerous ways accessible to those skilled in the art.

The invention claimed is:

1. A touchpad (10) system forming a human-machine interface for a vehicle steering wheel (1), comprising:
   a touchpad (10) configured to be mounted at a location on the steering wheel that is accessible to at least one digit (P) of a hand of a user of the steering wheel (1);
   a light source that emits light that illuminates the touchpad (10);
   a camera (20) that captures light of said light source that is reflected from the touchpad (10); and
   an electronic processing unit operatively connected to the camera to analyze light captured by the camera,
   said touchpad (10) formed as a blade having a first surface, an opposing second surface, and an edge surface that runs along a perimeter of the blade and that defines a thickness of the blade between the first and second surfaces, the touchpad (10) being transparent in a thickness direction to said light emitted by the light source, and having a first marker (15) located on a first edge face portion (12) of the edge surface of the touchpad (10) that is reflective of the light emitted by the light source,
   said touchpad (10), in a first configuration, being not visible to the camera (20), the first and second surfaces in the first configuration being transverse to a path of said light emitted from the light source, and the first edge face portion (12) in the first configuration being positioned so that a surface of the first marker (15) is oriented parallel with the path of said light emitted from the light source so as not to reflect said light emitted by the light source toward the camera,
   and said touchpad being configured such that a pressure applied to a first mobile part (11) of the touchpad (10) causes at least the first mobile part (11) of the touchpad (10) to move from the first configuration to a second configuration wherein said first marker (15) of the first edge face portion (12) is transverse to the path of said light emitted from the light source and reflects said light emitted from the light source toward the camera (20) and thereby is visible to the camera (20),
   wherein said electronic processing unit registers a passage of the first marker (15) from the first configuration to the second configuration, and vice versa, according to whether or not light of said light source reflected by the first marker (15) is received at the camera (20).

2. The touchpad (10) system as claimed in claim 1, wherein the first mobile part (11) of the touchpad (10) includes a first deformable part that is flexible such that said first deformable part bends upon application of the pressure applied to the first mobile part (11) of the touchpad (10).

3. The touchpad (10) system as claimed in claim 2,
   wherein said first deformable part has a deformation plateau configured so that said first deformable part deforms according to the pressure applied to said first mobile part (11),
   wherein the first configuration constitutes a stable rest position, and
   wherein said first deformable part passes from the first configuration to the second configuration discontinuously when the deformation generated by the pressure exerted on said first mobile part (11) reaches a predetermined threshold.

4. The touchpad (10) system as claimed in claim 3,
   wherein said first mobile part (11) comprises a domed zone (13), and
   wherein the deformation generated by the pressure exerted on said first mobile part (11) that causes said first mobile part (11) to pass from the first configuration to the second configuration generates an artifact detectable by the camera (20).

5. The touchpad (10) system as claimed in claim 1, wherein the touchpad (10) comprises a pivot mechanism providing rotational mobility to the touchpad (10).

6. The touchpad (10) system as claimed in claim 5,
   wherein the touchpad (10) also includes a second mobile part (14) having a second marker (16) distinct from the first marker (15), the second mobile part (14) being on a side of the pivot mechanism opposite that of the first mobile part (11), and the second marker (16) being on an edge of the touchpad (10) opposite the first marker (15), and wherein pressure applied to said touch pad at said second mobile part (14) of the touchpad (10) induces the second mobile part (14) of the touchpad (10) to move from a third configuration to a fourth configuration, the second mobile part (14) of the touchpad (10) and the second marker (16) being configured so that, when the second mobile part (14) of the touchpad (10) is in the third configuration said second marker (16) does not reflect said emitted light toward the camera (20) and, when the second mobile part (14) of the touchpad (10) is in the fourth configuration said second marker (16) reflects said emitted light toward the camera (20), the electronic processing unit configured to register emitted light reflected by the second marker (16).

7. The touchpad (10) system as claimed in claim 1, wherein the reflective first marker (15) is formed by a film applied to a zone of the first edge face portion (12) of the edge surface of the touchpad (10).

8. The touchpad (10) system as claimed in claim 1, wherein the reflective first marker (15) is formed by paint applied to a zone of the first edge face portion (12) of the edge surface of the touchpad (10).

9. The touchpad (10) system as claimed in claim 1, wherein the reflective first marker (15) is formed as a roughened area on a zone of the first edge face portion (12) of the edge surface of the touchpad (10).

10. The touchpad (10) system as claimed in claim 1, wherein the emitted light emitted by the light source is of a wavelength not visible to a human eye.

11. The touchpad (10) system as claimed in claim 10, wherein the emitted light emitted by the light source is of an infrared wavelength.

12. The touchpad (10) system as claimed in claim 1,
wherein the touchpad (10) also includes a second mobile part (14) having a second marker (16) distinct from the first marker (15), and wherein pressure applied to said touch pad at said second mobile part (14) of the touchpad (10) induces the second mobile part (14) of the touchpad (10) to move from a third configuration to a fourth configuration, the second mobile part (14) of the touchpad (10) and the second marker (16) being configured so that, when the second mobile part (14) of the touchpad (10) is in the third configuration said second marker (16) does not reflect said emitted light toward the camera (20) and, when the second mobile part (14) of the touchpad (10) is in the fourth configuration said second marker (16) reflects said emitted light toward the camera (20), the electronic processing unit configured to register emitted light reflected by the second marker (16).

13. The touchpad (10) system as claimed in claim 1, further comprising:
a second touchpad configured to be mounted on a side of a central hub of the steering wheel opposite that of said touchpad.

14. A motor vehicle comprising a steering wheel, a dashboard and an instrument panel mounted on said dashboard, further comprising a touchpad (10) system as claimed in claim 1.

15. The touchpad (10) system as claimed in claim 3, wherein the reflective first marker (15) is formed by a film applied to a zone of the first edge face portion (12) of the edge surface of the touchpad (10).

16. The touchpad (10) system as claimed in claim 1, wherein said touchpad (10) also includes an attachment portion, at a first end of the touchpad, that affixes to an inner circumferential portion of the vehicle steering wheel, a body of said touch pad extending from said interior circumferential portion of the vehicle steering wheel to said first edge face portion (12) located at a second end of the touchpad opposite the first end.

17. The touchpad (10) system as claimed in claim 1, wherein said second surface is arranged to face the camera, a motion of the touchpad from the first configuration to the second configuration causing the second surface to move in a direction toward the camera.

18. The touchpad (10) system as claimed in claim 1, wherein said touchpad (10) is configured to be positioned between the camera and the user.

19. The touchpad (10) system as claimed in claim 1, wherein said camera mounts in a vehicle dashboard.

* * * * *